United States Patent
Brender et al.

(10) Patent No.: US 12,270,881 B2
(45) Date of Patent: Apr. 8, 2025

(54) DENOISING OF DYNAMIC RESONANCE SPECTROSCOPIC IMAGING USING LOW RANK APPROXIMATIONS IN THE KINETIC DOMAIN

(71) Applicant: The United States of America, as Represented by the Secretary, Department of Health and Human Services, Bethesda, MD (US)

(72) Inventors: Jeffrey R. Brender, Washington, DC (US); James B. Mitchell, Damascus, MD (US); Kazutoshi Yamamoto, North Bethesda, MD (US); Shun Kishimoto, Rockville, MD (US); Jeeva P. Munasinghe, Rockville, MD (US); Hellmut Merkle, Bethesda, MD (US); Murali K. Cherukuri, Potomac, MD (US)

(73) Assignee: The United States of America, as represented by the Secretary, Department of Health and Human, Services Bethesda (MD)

(*) Notice: Subject to any disclaimer, the term of this patent is extended or adjusted under 35 U.S.C. 154(b) by 467 days.

(21) Appl. No.: 17/576,283

(22) Filed: Jan. 14, 2022

(65) Prior Publication Data
US 2022/0214415 A1 Jul. 7, 2022

Related U.S. Application Data

(63) Continuation of application No. 16/485,772, filed as application No. PCT/US2018/018217 on Feb. 14, 2018, now abandoned.

(Continued)

(51) Int. Cl.
*G01R 33/56* (2006.01)
*G01R 33/485* (2006.01)
(Continued)

(52) U.S. Cl.
CPC ....... *G01R 33/5608* (2013.01); *G01R 33/485* (2013.01); *G06T 5/70* (2024.01); *G06T 2207/10088* (2013.01)

(58) Field of Classification Search
None
See application file for complete search history.

(56) References Cited

U.S. PATENT DOCUMENTS 5,121,337 A * 6/1992 Brown ............... G01N 21/3504
702/28
5,446,681 A * 8/1995 Gethner ............... G01R 35/005
703/2

(Continued)

OTHER PUBLICATIONS

Brender et al., "PET by MRI: Glucose Imaging by $^{13}$C-MRS without Dynamic Nuclear Polarization by Noise Suppression through Tensor Decomposition Rank Reduction," available at: https://dx.doi.org/10.1101/265793, 22 pages, first posted online Feb. 15, 2018, retrieved on Aug. 9, 2019.

(Continued)

*Primary Examiner* — Baisakhi Roy
(74) *Attorney, Agent, or Firm* — Leydig, Voit & Mayer, Ltd.

(57) ABSTRACT

Kinetic monitoring of in vivo metabolism of labelled tracers is based on singular value decomposition or Tucker Decomposition of magnetic resonance spectral image data. Data decomposition is used in conjunction with rank reduction to improve signal-to-noise ratio. Rank reduction can be applied in one or more of a spectral, spatial, or temporal dimension. Rank is generally reduced based on a number of expected analytes/metabolites or fit of measured data to a model.

10 Claims, 11 Drawing Sheets

Related U.S. Application Data

(60) Provisional application No. 62/459,008, filed on Feb. 14, 2017.

(51) Int. Cl.
  *G06T 5/00* (2024.01)
  *G06T 5/70* (2024.01)

(56) References Cited

U.S. PATENT DOCUMENTS

| | | | |
|---|---|---|---|
| 9,218,659 | B2 | 12/2015 | Kim et al. |
| 2003/0162301 | A1* | 8/2003 | Noergaard ............ A61B 5/7267 422/52 |
| 2007/0240242 | A1* | 10/2007 | Modiano ................ G06Q 50/02 435/40.5 |
| 2009/0247860 | A1 | 10/2009 | Djuric et al. |
| 2014/0122586 | A1* | 5/2014 | Kao ........................ G06Q 50/01 709/204 |
| 2015/0285889 | A1 | 10/2015 | Chen et al. |
| 2016/0202336 | A1* | 7/2016 | Liang ................... G01R 33/561 324/309 |
| 2016/0284080 | A1* | 9/2016 | Unal ....................... G06T 17/20 |
| 2017/0165380 | A1 | 6/2017 | Clark et al. |
| 2018/0217217 | A1* | 8/2018 | Weingartner .......... G01R 33/50 |
| 2018/0306882 | A1* | 10/2018 | Li ........................... A61B 5/055 |
| 2020/0041591 | A1* | 2/2020 | Weingartner ........ A61B 5/7285 |

OTHER PUBLICATIONS

Brender et al., "PET by MRI: Glucose Imaging without Dynamic Nuclear Polarization by Tensor Decomposition Rank Reduction," ENC 2017 Book of Abstracts, 1 page, dated Mar. 20, 2017, retrieved on Aug. 9, 2019.

Bydder et al., "Noise reduction in multiple-echo data sets using singular value decomposition," *Magnetic Resonance Imaging*, 24:849-856 (2006).

De Lathauwer et al., "A Multilinear Singular Value Decomposition," *Society for Industrial and Applied Mathematics*, 21:1253-1278 (2000).

Hatch et al., "Analysis and compression of six-dimensional gyrokinetic datasets using higher order singular value decomposition," *Journal of Computational Physics*, 231:4234-4256 (2012).

International Search Report and Written Opinion from International Application No. PCT/US2018/018217, dated Jun. 20, 2018, 28 pages.

Kim et al., "Nonnegative Tucker Decomposition," *2007 IEEE Conference on Computer Vision and Pattern Recognition*, pp. 1-8 (Jun. 2007).

Kolda et al., "Tensor Decompositions and Applications," *Society for Industrial and Applied Mathematics*, 51:455-500 (2009).

Ma et al., "High-resolution dynamic $^{31}$P-MRSI using a low-rank tensor model," *Magnetic Resonance in Medicine*, 78:419-428 (May 28, 2017).

Nguyen et al., "Denoising MR Spectroscopic Imaging Data With Low-Rank Approximations," *IEEE Trans. Biomed. Eng.*, 60:78-89 (Jan. 2013).

Pijnappel et al., "SVD-Based Quantification of Magnetic Resonance Signals," Journal of Magnetic Resonance, 97:122-134 (1992).

Rodrigues et al., "Magnetic resonance imaging of tumor glycolysis using hyperpolarized 13C-labeled glucose," Nature Medicine, 20:93-98 (Jan. 2014).

Saunders et al., "Continuing Ischemic Damage after Acute Middle Cerebral Artery Infarction in Humans Demonstrated by Short-Echo Proton Spectroscopy," Stroke, 26:1007-1013, originally published Jun. 1, 1995, retrieved on Jan. 6, 2017.

Schroeder et al., "Hyperpolarized Magnetic Resonance: A Noval Technique for the In Vivo Assessmnet of Cardiovascular Disease," Circulation, 124(14): 1580-1594 (2011).

Stamatopoulos et al., "On an efficient modification of singular value decomposition using independent component analysis for improved MRS denoising and quantification," Measurement Science and Technology, 20:1-9 (Sep. 4, 2009).

Vasilescu, "Are there any concrete examples to understand Higher Order SVD (Tucker decomposition)?" available at: https://www.quora.com/Are-there-any-concrete-examples-to-understand-Higher-Order-SVD-Tucker-decomposition, 2 pages, last updated May 21, 2016, retrieved on Jan. 25, 2017.

Wang et al., "Relaxation Times of Skeletal Muscle Metabolites at 7T," Journal of Magnetic Resonance Imaging, 29:1457-1464 (2009).

Zhang et al., "Denoise diffusion-weighted images using higher-order singular value decomposition," NeuroImage, 156:128-145 (Apr. 15, 2017).

Zhang et al., "Denoising of 3D magnetic resonance images by using higher-order singular value decomposition," Medical Image Analysis, 19:75-86 (Sep. 18, 2014).

\* cited by examiner

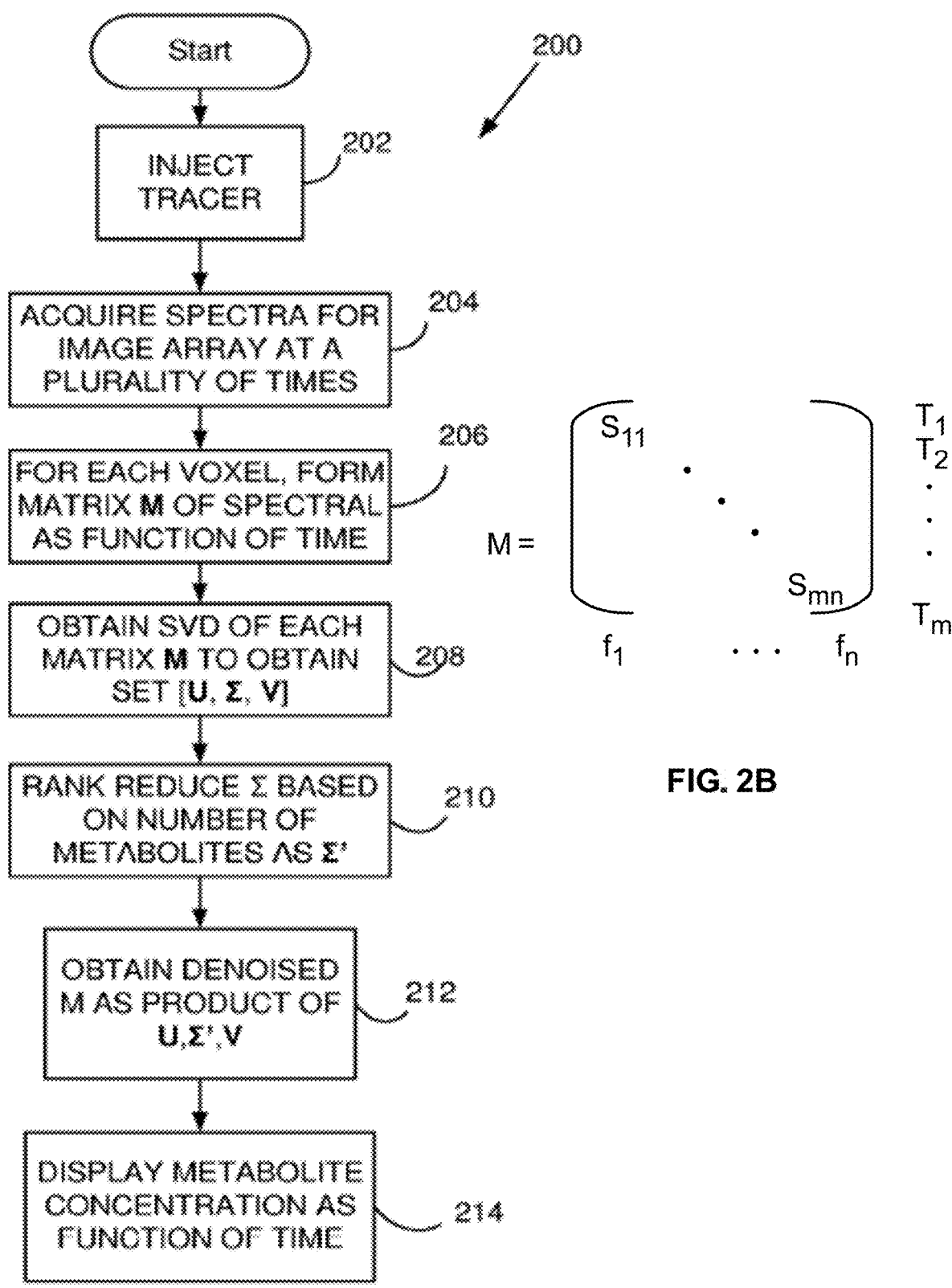

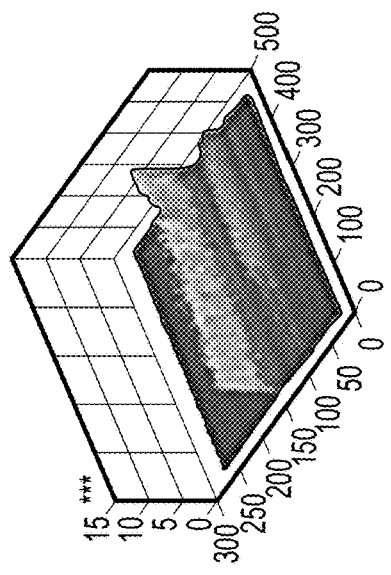
FIG. 9B
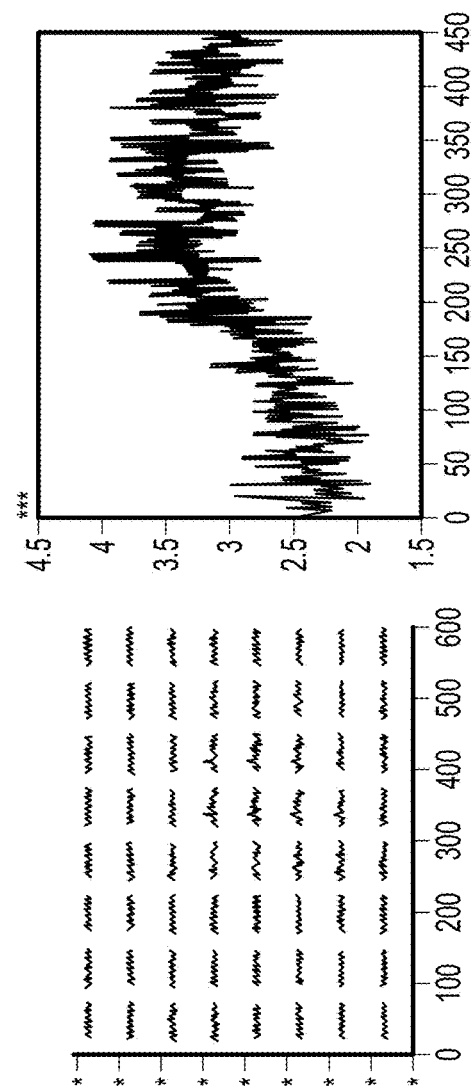
FIG. 9D
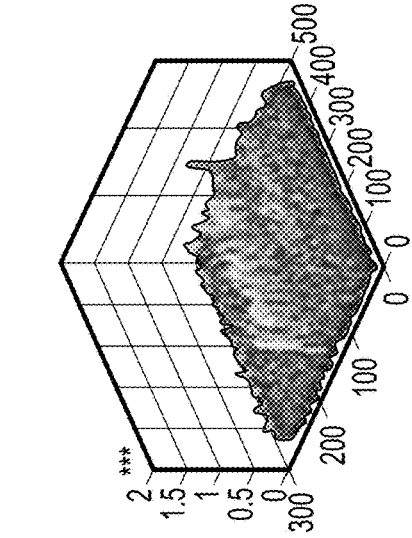
FIG. 9A
FIG. 9C
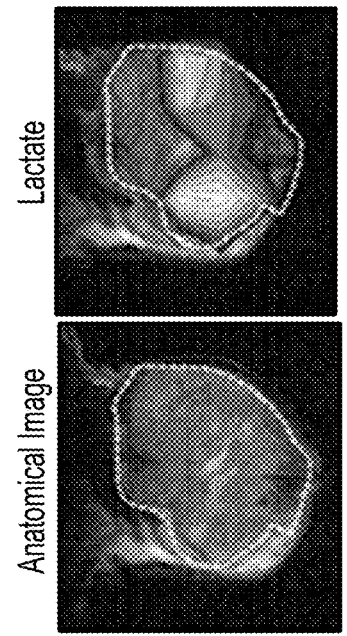
FIG. 8A  Anatomical Image
FIG. 8B  Lactate
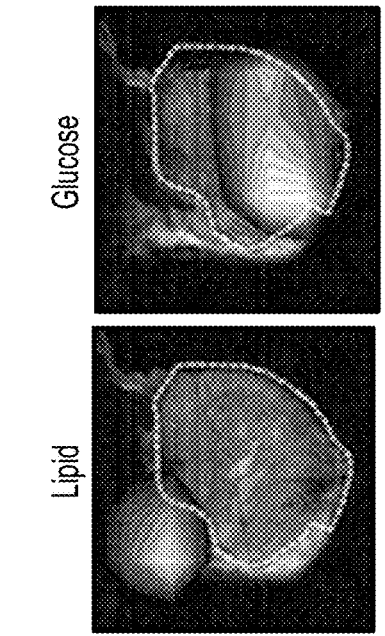
FIG. 8C  Lipid
FIG. 8D  Glucose

DENOISING OF DYNAMIC RESONANCE SPECTROSCOPIC IMAGING USING LOW RANK APPROXIMATIONS IN THE KINETIC DOMAIN

CROSS REFERENCE TO RELATED APPLICATIONS

This is a continuation patent application that claims the benefit of U.S. patent application Ser. No. 16/485,772 filed on Aug. 13, 2019, which is a 371 national patent application of PCT/US2018/018217 filed on Feb. 14, 2018 which claims the benefit of U.S. Provisional Application No. 62/459,008, filed Feb. 14, 2017, which are herein incorporated by reference in their entirety.

FIELD

The disclosure pertains to methods and apparatus that can proved improved signal to noise ratios in spectroscopic magnetic resonance imaging.

BACKGROUND

The breakdown of exogenous metabolic tracers can be tracked non-invasively and precisely by $^{13}C$ MRI, which is an advantage over static techniques which measure the equilibrium state which may stem from many processes. Further progress remains limited by poor sensitivity stemming from three fundamental reasons. First, the amount of exogenous tracer that can be injected is limited to only small amounts due to the difficulty of preparing highly concentrated solutions and injecting large volumes as well as the potential toxicity of many compounds. Even in the most favorable situations, the effective concentration of exogenous metabolic tracers is far less than the water signal detected in conventional MRI. As an additional complication, $^{13}C$ has a low gyromagnetic ratio which translates into a relative sensitivity compared to that of $^1H$ (the nuclei normally used in MRI) for an equivalent number of nuclei. Finally, metabolic processes are inherently transient. The usual approach to overcoming low sensitivity is to simply acquire the signal for longer and average the scans. Often, however it is the rate of turnover of a metabolite which is of interest rather than the absolute concentration. The rate of turnover is a direct link to the activity of metabolic enzymes that are potential targets in cancer and other pathologies. Long signal averaging makes recovery of the rate impossible.

To enable kinetic monitoring of in vivo metabolism, dynamic nuclear polarization (DNP) was developed to make rapid dynamic imaging of $^{13}C$ labeled tracers possible. Dynamic nuclear polarization makes use of the fact that unpaired electrons in a paramagnetic molecule can be aligned to a magnetic field to a much greater extent than the atomic nuclei with spins detected by MRI. Dynamic nuclear polarization transfers this alignment from unpaired electrons back to the atomic nuclei for detection. Since the signal in MRI is proportional to the degree of alignment, this polarization transfer results in a very large increase in the MRI signal, up to 10,000 times in favorable circumstances. Unfortunately, the polarization transfer only occurs efficiently at temperatures near absolute zero and decays quickly once at room temperature. Dissolution DNP (dDNP) has been successful in utilizing a portion of the polarization to conduct metabolic MRI by rapidly dissolving the frozen tracer at ~1 K to room temperature with a significant quantity of polarization still available for detection. DNP has been critical in many scientific advances. Perhaps most impressively, DNP has been used to prove drug target engagement by imaging tumor glycolysis in a mouse model.

Despite dDNP's impressive technical achievements, it has significant disadvantages, especially in a clinical setting: hyperpolarization is performed at temperatures near absolute zero, requiring an apparatus that is expensive in both capital and operating costs. Hyperpolarization is transient, limiting analysis of metabolic cycles to products produced immediately after the injection of the injected metabolite. Hyperpolarization is limited to a small set of molecules whose relaxation time is slow enough that the polarization is not lost before the kinetics can be determined. Many key metabolites, such as glucose, have short relaxation times and are difficult or impossible to image with DNP for this reason. This disclosure is directed to methods and apparatus that can address these limitations by enabling kinetic monitoring of in vivo metabolism of labelled tracers without DNP.

SUMMARY

Methods comprise acquiring a magnetic resonance imaging signal associated with a plurality of chemical shifts for at least one voxel at a plurality of times and arranging the magnetic resonance imaging signal as a data matrix. A singular value decomposition of the data matrix is obtained and rank reduced, and a rank-reduced data matrix is determined based on the rank-reduced singular value decomposition. In some examples, the rank reducing is based on a number of analytes. In further examples, a tracer is injected so that the acquired magnetic resonance imaging signal is associated with metabolism of the tracer, wherein the analytes include the tracer or one more metabolic products associated with the tracer. In one example, the number of analytes corresponds to a number of metabolic products.

According to a representative embodiment, the data matrix is an m×n data matrix, m is an integer number of measurement times and n is an integer number of measured chemical shifts and the singular value decomposition includes matrices U, Σ, $V^T$, wherein U is an m×m unitary matrix, Σ is a diagonal m×n matrix with non-negative real numbers on the diagonal, and $V^T$ is an n×n orthogonal matrix. Typically, rank reduction includes setting r smallest diagonal values of the matrix Σ to zero to form a matrix Σ', wherein the rank-reduced data matrix is obtained as a matrix product U·Σ'·$V^T$. In some cases, the diagonal values of the matrices Σ and Σ' are arranged in rows of the matrices from largest to smallest. In still further examples, the magnetic resonance imaging signal is associated with the plurality of chemical shifts for the plurality of voxels at the plurality of times, and for each voxel, the magnetic resonance imaging signal is arranged as a data matrix, a singular value decomposition of the data matrix is obtained that is then rank reduced, and rank reduced data matrices are produced for each of the plurality of voxels.

Magnetic resonance imaging apparatus comprise a magnet situated to establish an axial magnetic field in a specimen and a plurality of coils situated to apply electromagnetic pulse sequences to the specimen. A receiver is situated to detect electromagnetic signals from the specimen in response to the applied electromagnetic pulse sequences. A controller is coupled to the plurality of coils so as to selectively apply the electromagnetic pulse sequences and to the receiver to store signal values associated with the detected signals for a plurality of specimen voxels, and process the detected signals by rank reducing a singular value decomposition associated with a matrix representation associated with at least one of the plurality of specimen voxels. In a representative example, the controller processes the detected signals by rank reducing singular value decompositions associated with matrix representations associated with each the plurality of specimen voxels and the rank reductions of the singular value decompositions are based on a number of analytes. In a further example, an injector is situated to inject a tracer into the specimen, the injector coupled to the controller so that the detected electromagnetic signals are associated with metabolism of the injected tracer, wherein the analytes include the tracer or one more metabolic products associated with the tracer. Typically, they number of analytes corresponds to a number of metabolic products. According to typical examples, the matrix representation for each voxel is an m×n data matrix, wherein m is an integer number of measurement times and n is an integer number of measured chemical shifts and the singular value decomposition includes matrices U, $\Sigma$, $V^T$, wherein U is an m×m unitary matrix, $\Sigma$ is a diagonal m×n matrix with non-negative real numbers on the diagonal, and $V^T$ is an n×n orthogonal matrix. In some embodiments, rank reduction includes setting r smallest diagonal values of the matrices $\Sigma$ to zero to form matrices $\Sigma'$, wherein the rank-reduced data matrices are obtained as matrix products $U \cdot \Sigma' \cdot V^T$. In one example, the magnetic resonance imaging signal is associated with the plurality of chemical shifts for the plurality of voxels at the plurality of times, and for each voxel, the magnetic resonance imaging signal is arranged as a data matrix, a singular value decomposition of the data matrix is obtained that is then rank reduced, and rank reduced data matrices are produced for each of the plurality of voxels. According to other examples, an image is displayed using the rank reduced data matrices.

Methods comprise acquiring a magnetic resonance imaging signal associated with a plurality of chemical shifts for a plurality of voxels at a plurality of times and arranging the acquired magnetic resonance imaging signals as a data tensor. A Tucker decomposition of the data tensor and spatially or temporally rank reduced to produce spatially or temporally denoised voxel data for each of the plurality of voxels. According to some examples, a tracer is injected so that the acquired magnetic resonance imaging signal is associated with metabolism of the tracer, wherein the analytes include the tracer or one more metabolic products associated with the tracer. In some examples, the rank reduction is spectral rank reduction based on a number of metabolic products.

Other methods acquiring magnetic resonance imaging signals for a plurality of voxels as a function of at least two parameters and arranging the magnetic resonance imaging signals as a data tensor. A Tucker decomposition of the data tensor is obtained and rank reduced with respect to produce processed voxel data for each of the plurality of voxels based on at least one of the two parameters. In some cases, rank reduction is based on both of the at least two parameters.

BRIEF DESCRIPTION OF THE DRAWINGS

FIG. 2A illustrates a representative method of acquiring MRI spectral data and processing the acquired data using a singular value decomposition (SVD) with rank reduction.

FIG. 2B illustrates a representative arrangement MRI spectral data as a function of time for a single voxel.

FIGS. 8A-8D show images associated with glucose metabolism illustrating denoising based on rank reduced SVDs.

FIGS. 9A and 9B show signals associated with an individual voxels without and with denoising; respectively.

FIG. 9C shows denoised signals for each of 64 voxels.

FIG. 9D shows noisy data for one voxel.

DETAILED DESCRIPTION

Figure 1:
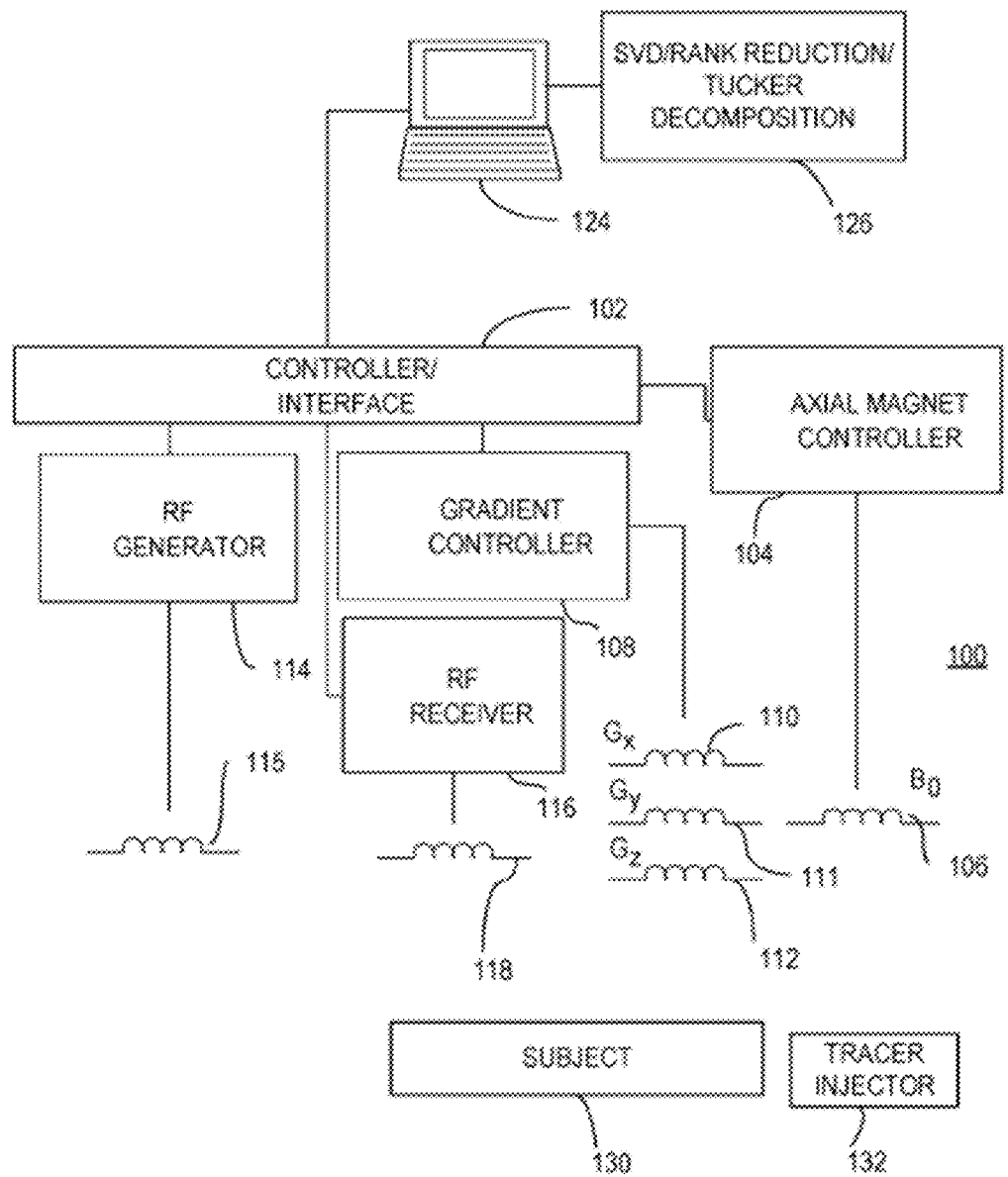
FIG. 1 illustrates a representative magnetic resonance imaging (MRI) system that includes singular value decomposition (SVD) and Tucker decomposition signal processing.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Disclosed herein are signal processing methods and magnetic resonance imaging (MRI) apparatus that permit the recovery of dynamic information from a noisy signal obtained by, for example, a magnetic resonance spectroscopic imaging (MRSI) or other magnetic resonance imaging (MRI) procedure. Typical MRI procedures include single pulse or Chemical Shift Imaging (CSI) pulse sequences with proton decoupling, Echo Planar Spectroscopic Imaging or Spectrally Encoded Imaging sequences. In one representative example provided for illustration, the disclosed approaches are used in metabolite imaging or in single voxel measurements in response to intravenous injection of a $^{13}C$ labelled tracer in the tail vein of a mouse with leg xenograft. An infusion pump (or other pump) may be used to scale up the procedure for human clinical applications, and injection synchronized with metabolite measurement sequences. This example is provided for convenient explanation, but the disclosed methods and apparatus can use different magnetic resonance pulse sequences and be used with other tracers, and can be generally applied to determine time evolutions of material constituents, and are not limited to use in estimating metabolic rates.

MR measurements of chemical shifts are generally made at a plurality of times; while chemical shifts can be measured for a continuous range of chemical shift values, typically chemical shift values are processed as a series of discrete values. While it can be convenient to select uniformly spaced chemical shifts and measurement times, this is generally unnecessary and arbitrary spacings can be used. Finer increments can be used for ranges of interest or for values associated with larger rates of change. For convenience, uniform time and chemical shift increments are used in some examples. Data matrices and tensors are written in bold (M) or as italics (M); elements of such matrices and tensors are written in italics with subscripts that identify particular elements ($M_{ij}$). A transpose of a matrix M is written as $M^T$. Elimination of certain terms in matrix or tensor representations is generally referred to herein as rank reduction or truncation. While it is generally preferred to eliminate terms in rank reduction or truncation (by, for example, setting values to 0), terms can be assigned small values instead, generally small enough to avoid significantly decreasing signal to noise ratios available with term elimination.

MR measurements can be obtained using an MRI apparatus 100 as illustrated in FIG. 1. The apparatus 100 includes a controller/interface 102 that can be configured to apply selected magnetic fields such as constant or pulsed field gradients to a specimen. An axial magnet controller 104 is in communication with an axial magnet 106 that is generally configured to produce a substantially constant magnetic field $B_0$. A gradient controller 108 is configured to apply a constant or time-varying gradient magnetic field in a selected direction or in a set of directions using magnet coils 110-112 to produce respective magnetic field gradient vector components $G_x$, $G_y$, $G_z$ or combinations thereof. An RF generator 114 is configured to deliver one or more RF pulses to a specimen using a transmitter coil 115. An RF receiver 116 is in communication with a receiver coil 118 and is configured to detect or measure net magnetization of spins. Slice selection gradients can be applied with the same hardware used to apply the diffusion gradients. The gradient controller 108 can be configured to produce pulses or other gradient fields along one or more axes. By selection of such gradients and other applied pulses, various imaging and/or measurement sequences can be applied. Sequences that produce variations that are functions of analyte or metabolite concentration are preferred. In typical examples, data containing chemical shifts as functions of time is acquired.

For imaging, specimens are divided into volume elements (voxels) and MR signals at different times are acquired. In typical examples, amplitude as a function of chemical shift at each of a plurality of times is obtained for some or all voxels of interest. A computer 124 or other processing system such as a personal computer, a workstation, a personal digital assistant, laptop computer, smart phone, or a networked computer can be provided for acquisition, control and/or analysis of specimen data. The computer 124 generally includes a hard disk, a removable storage medium such as a floppy disk or CD-ROM, and other memory such as random access memory (RAM). Computer-executable instructions for data acquisition or control can be provided on a floppy disk or other storage medium, or delivered to the computer 124 via a local area network, the Internet, or other network. Signal acquisition, instrument control, and signal analysis can be performed with distributed processing. For example, signal acquisition and signal analysis can be performed at different locations. The computer 124 can also be configured to improve signal-to-noise using singular value decomposition with rank reduction or Tucker decomposition using suitable computer-executable instructions stored in a memory 126. Signal evaluation can be performed remotely from signal acquisition by communicating stored data to a remote processor. Typically, various field are applied to and detected from a subject 130 in association with application (generally injection) of a tracer by an injector 132.

In typical examples, MRSI sequences are used, resulting in a data grid with a spectrum in each point (voxel) representing metabolites present in that spatial area. In dynamic MRSI, the image is repeatedly acquired after injection to give a time profile of in vivo metabolism. Under normal conditions without DNP, this signal is too noisy too use. The denoising approaches disclosed herein are typically based on the assumption that only a few metabolites are present, and in some cases, that the associated signals vary smoothly as a function of time. More formally, the number of independent peaks in the spectrum is assumed to be much less than the number of data points (sparsity) and the second order finite difference between time points is small. The first assumption is essentially never violated—a typical MRSI spectrum has 256 or more points but only a dozen or so metabolites can be detected, and then only under very favorable conditions. The second assumption concerning smooth variation in time can be implemented by an adjustable parameter as described below to match the expected time scale, but while this assumption may be useful, it is generally not necessary. While the methods and apparatus are referred to as "denoising," noise need not be completely removed.

SVD with Rank Reduction

Processing starts by forming a matrix S for each voxel with the spectrum from each time point forming a row in the matrix. Noise reduction is achieved by reducing the rank of S. The rank of S is the vector space spanned by the columns (spectra) of S. More intuitively, the rank of S is the number of independent spectra existing in the dynamic course (or alternatively, the number of independent kinetic components, which is a mathematically equivalent). A rank of 1 implies the signal can be completely described as a single spectrum which decays with a single time profile. The spectra and time profile can be any arbitrary shape, but are uniform. In this case, no individual peak in the spectra decays at a different rate than any other. A signal matrix with a rank of 2 can be described as a linear combination of two spectra, with two distinct time profiles. A rank 3 matrix is a linear combination of three spectra with three distinct time profiles and so on. From this definition, the rank of the matrix S is approximately equal to the number of metabolites in the sample. However, a rank reduction as discussed below result in a rank that is greater than or less than a number of metabolites, and generally, rank reduction can be selected based on a suitable output (e.g., noise removal).

In practice, the signal is perturbed by noise. Since noise is random and not correlated in frequency or time, the actual rank r of the measured matrix is close to the number of spectral points (256 or more). However, the actual signal matrix without noise is low rank. A low rank approximation (matrix M) of matrix S is to be determined. S is first decomposed into a product of three smaller matrices:

$$S_{noisy} = U \cdot \Sigma \cdot V^T,$$

wherein [U, Σ, V] is the singular value decomposition of the measured data matrix $S_{noisy}$, and denoised low rank approximation $M_{low\ rank}$ can be found.

$$S_{noisy} \sim M_{low\ rank} = [U, \Sigma, V] = \underset{U,\Sigma,V}{\mathrm{argmin}}\{\|S_{noisy} - U\Sigma V^T\|^2\}.$$

For the original, noisy matrix, the solution is for the diagonal entries of Σ to be equal to the square roots of the eigenvalues of $S^TS$, the columns of V to be equal to the eigenvectors of $S^TS$, and the columns of U to be equal to the eigenvectors of $SS^T$. This is known as a singular value decomposition. The rank r is equal the number of non-zero eigenvalues. To get a low rank approximation, the lowest r-n diagonal entries in Σ are set to zero. The rank r can be estimated to be slightly above the number of metabolites present (usually known a priori) or can be estimated from a distribution of eigenvalues using the properties of random matrices. The result is guaranteed by the Eckart-Young-Mirsky theorem to be the best low rank approximation to the original signal matrix S. Smoothness can be enforced by imposing a penalty term on the equation above:

$$M_{low\ rank} = [U, \Sigma, V] = \underset{U,\Sigma,V}{\mathrm{argmin}}\{\|S_{noisy} - U\Sigma V^T\|^2 + a_u\|B_u U\| + a_v\|B_v V\|\}$$

where $B_u$ and $B_v$ are second order finite difference operators. This altered form of the equation penalizes rapid, unphysiological time changes in the signal and is controlled by the parameters $a_u$ and $a_v$. Small values of these parameters allow rapid changes, large values favor smoothness. The actual value may be altered for the particular experiment. For demonstration purposes, $a_u$ can be set to 0 to allow high resolution in the spectral domain.

Referring to FIG. 2A, a method 200 of measuring or imaging metabolites in vivo using SVD and rank reduction includes injecting a tracer at 202. As used herein, a tracer is any composition that is metabolized in vivo or stimulates metabolism of a compound. At 204, MR spectra are acquired for an image array at a plurality of times. The image array typically includes data for a plurality of volume elements ("voxels"), but single point (i.e., single voxel) measurements can also be made. At 206, for each voxel of interest (or all voxels), a matrix M of spectral data as a function of time is formed. Such a matrix is illustrated in FIG. 2B. Each row includes signal values $S_{ij}$ associated with time i, wherein i=1, ..., m and chemical shifts $f_j$, wherein j=1, ..., n. In other examples, rows can be associated with fixed chemical shifts and each column associated with a different time. Typically, SVD is arranged so that column vectors span a data space, and with such an arrangement, assigning each row to a different time produces SVDs in which rank reduction results in temporally denoised data. By contrast, using row vectors produces SVDs in which rank reduction results is spatially denoised data. In FIG. 2B, only a single matrix M is shown, but such an arrangement is generally formed for each voxel of interest, or all voxels.

At 208, SVDs of some or all m×n data matrices M are obtained to find SVD arrays U, Σ, $V^T$ for each M, wherein U is an m×m unitary matrix, Σ is a diagonal m×n matrix with non-negative real numbers (for example, eigenvalues of the matrix products $M^T M$) on the diagonal, and $V^T$ is an n×n unitary matrix (and typically an orthogonal matrix for data values represented as real numbers). SVD can use other data arrangements by interchanging rows and columns, if desired. At 210, the diagonal matrices Σ for each (or some) voxels are rank reduced to corresponding matrices Σ' by setting unselected diagonal elements to zero. Typically, a number of non-zero diagonal entries is retained that corresponds to a number of metabolites produced in response to the tracer injection, and only the largest diagonal values are kept. Generally rows of Σ and Σ' are arranged so that a largest value appears in the first row, the next largest in the second row, etc. At 212, a denoised signal matrix M' for each voxel is then obtained as a product M'=UΣ'V$^T$. At 214, denoised data can be displayed as one or more images, a sequence of images, or as numerical data, as preferred. If desired, several different rank reductions can be used to determine a preferred rank reduction (i.e., a preferred matrix Σ').

Second order differences can be used as well, if desired. Forward, central, or reverse second order differences can be used. For example, a central second order difference of a function $f(x)$ defined as $$f''(x) = \frac{f(x+\Delta) - 2f(x) + f(x-\Delta)}{\Delta^2}$$

can be used, wherein Δ denotes an interval between data values (in this case, either time or spatial intervals, depending on whether temporal or spatial smoothing is to be applied). In this case, denoised data is obtained from:

$$M_{low\,rank} = [U, \Sigma, V] = \underset{U,\Sigma,V}{\mathrm{argmin}}\{\|S_{noisy} - U\Sigma V^T\|^2 + a_u\|B_u U\| + a_v\|B_v V\|\}$$

as discussed above. Various values of $a_u$ and $a_v$ can be used, and typical values are 0.01, 0.02, 0.05, 0.10, 0.20, 0.50, or 1.00 or intermediate values.

Selecting the Number of Ranks in SVD

There are several ways to select the number of ranks when using SVD. The first is to use a priori knowledge. For example, as noted above, if at most n metabolites are possible, the rank can be set to a number near n. This number can be set slightly higher, to capture low abundance metabolites that might be near the noise level, or slightly lower, to as the kinetics of the metabolites are linked and therefore not linearly independent. Thus, for n metabolites, the rank can be set to n or n±1, 2, 3. Other values can be used as well, values in these ranges are generally sufficient.

Figure 17:
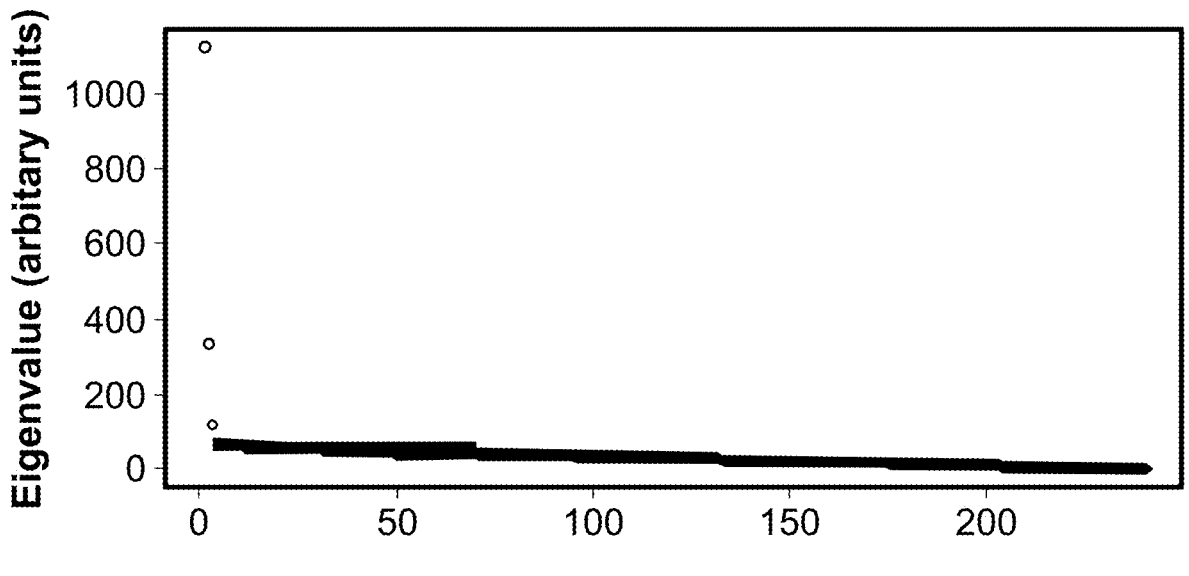
FIG. 17 is a representative Scree plot obtained from FIG. 5A indicating a number of eigenvalues to select in rank reduction.

Another method is based on a Scree plot. A scree plot displays eigenvalues associated with each component in descending order. An ideal pattern in a scree plot is a steep curve, followed by a bend and then a flat or horizontal line. The rank is set to the point of the bend, as the flat line represents noise. FIG. 17 illustrates a representative Scree plot, indicating that a rank of 3 should be selected.

Scree plots are ultimately based on the statistics of the distribution of the eigenvalues of random matrices. It has been shown (see Gavish and Donoho, "The Optimal Hard Threshold for Singular Values is 4/√3," IEEE Trans. Inform. Theory 60:5040-5053 (2014), which is incorporated herein by reference) that the optimal hard threshold level τ* for an m by n matrix is:

$$\tau_* = \lambda_*(\beta) \cdot \sqrt{n}\,\sigma$$

$$\lambda_*(\beta) \overset{def}{=} \sqrt{2(\beta+1) + \frac{8\beta}{(\beta+1) + \sqrt{\beta^2 + 14\beta + 1}}}\,.$$

β is an aspect factor $$\beta = \frac{m}{n}$$

and σ is a standard deviation of the noise level, which can be guessed by examining a region of the spectrum where no metabolites are known to be present. Every singular value below τ* is set to zero.

Tucker Decomposition with Rank Reduction

As discussed above, SVD-based approaches process data voxel by voxel using data matrices for each voxel. A data matrix M having rows and columns corresponding to selected times and chemical shifts is defined, and denoised using SVD. For imaging, simultaneous spatial and temporal denoising can be provided using the Tucker Decomposition on all voxels simultaneously. The Tucker Decomposition decomposes data into a set of matrices that correspond to images that describe the evolution of the signal in both space and time. Similar to SVD, a low rank approximation is made to find a linear combination of images that suppresses noise while retaining as much of the signal as possible. The ability to denoise in spatial dimensions allows the method to be used on a series of medical images of any type as long as there is some pattern connecting the images. If desired, only selected rows or columns or other selected data is processed, and the associated data tensor can be of lower rank that that of a data tensor representing a complete data set. With image and spectral data (i.e., chemical shifts) for all points, voxel data is represented as a fourth order tensor X which includes values for the chemical shifts and measurement times for all voxels of an image. For convenient explanation, only selected tensor nomenclature and procedures are discussed herein. A summary can be found in, for example, Kolda and Bader, "Tensor Decompositions and Applications," SIAM Review 51:455-500 (2009), which is incorporated herein by reference.

For images containing K by L voxels, each voxel associated with n chemical shifts at m times, wherein K, L, M, N are all positive integers, data tenors of rank 3 or 4 can be used. For example, representations as fourth order data tensor $X^{K \cdot L \cdot M \cdot N}$ or as a third order tensor $X^{K \cdot L \cdot M \cdot N}$ can be used. As with SVD, a factorization is required. For X represented by an I by J by K element matrix, a Tucker factorization is of the form:

$$X = G \cdot A \cdot B \cdot C = \Sigma_{p=1}^{P} \Sigma_{q=1}^{Q} \Sigma_{r=1}^{R} g_{pqr} a_p \circ b_q \circ c_r,$$

wherein G can be referred to as a core tensor, A, B, C are I by P, J by Q, and K by R factor matrices, respectively, and $a_p$, $b_q$, $c_r$ refer to columns of the corresponding factor matrices, and the symbol ○ refers to a vector outer product. The Tucker decomposition can also be expressed element wise as:

$$x_{ijk} = \Sigma_{p=1}^{P} \Sigma_{q=1}^{Q} \Sigma_{r=1}^{R} g_{pqr} a_p \circ b_q \circ c_r,$$

wherein $x_{ijk}$, $b_{jq}$, and $c_{kr}$ are elements of G, A, B, and C. A, B, C are orthogonal matrices and the core tensor G is an orthogonal tensor. G can be arranged so that subtensors $G_{i_n}$ are ordered so that $\|G_{i_n=1}\| \geq \|G_{i_n=2}\| \geq \ldots \geq \|G_{i_n=I_n}\|$.

For images containing K by L voxels and S slices, each voxel is associated with N free induction decay points acquired at M time points, and wherein K, L, M, N, S are all positive integers, data tensors of rank 4 or 5 can be used. For example, representations as fourth order data tensor $X^{K \cdot L \cdot M \cdot N}$ or as a fifth order tensor $X^{K \cdot L \cdot M \cdot N \cdot S}$ can be used. As with SVD, a factorization is required. For a third order tensor X represented by an I by J by K element matrix, a Tucker factorization is of the form:

$$X = G \cdot A \cdot B \cdot C = \Sigma_{p=1}^{P} \Sigma_{q=1}^{Q} \Sigma_{r=1}^{R} g_{pqr} a_p \circ b_q \circ c_r,$$

wherein G can be referred to as a core tensor, A, B, C are I by P, J by Q, and K by R factor matrices, respectively, and $a_p$, $b_q$, $c_r$ refer to columns of the corresponding factor matrices, and the symbol ○ refers to a vector outer product. Tensor representations of higher order can be used, and decomposed in the same way.

The Tucker decomposition can also be expressed element wise as:

$$x_{ijk} = \sum_{p=1}^{P}\sum_{q=1}^{Q}\sum_{r=1}^{R} g_{pqr} a_{ip} b_{jq} c_{kr}$$

wherein $g_{pqr}$, $a_{ip}$, $b_{jq}$, and $c_{kr}$ are elements of G, A, B, and C. A, B, C are orthogonal matrices and the core tensor G is an orthogonal tensor. G can be arranged so that subtensors $G_{i_n}$ are ordered so that $\|G_{i_n=1}\| \geq \|G_{i_n=2}\| \geq \ldots \geq \|G_{i_n=I_n}\|$.

Rank reduction in Tucker Decomposition tends to be more difficult than in SVD. In SVD, there is essentially one degree of freedom, the number of eigenvalues to keep. The Tucker Decomposition has additional flexibility in that compression (truncation of the core tensor G) can be carried out in one or more directions and not in others. For example, the rank in the spectral dimension can be reduced, without rank reduction in image dimensions as discussed below with reference to FIGS. 10A-13B. Generally, truncation can be selected for some or all data dimensions, as preferred.

Figure 18:
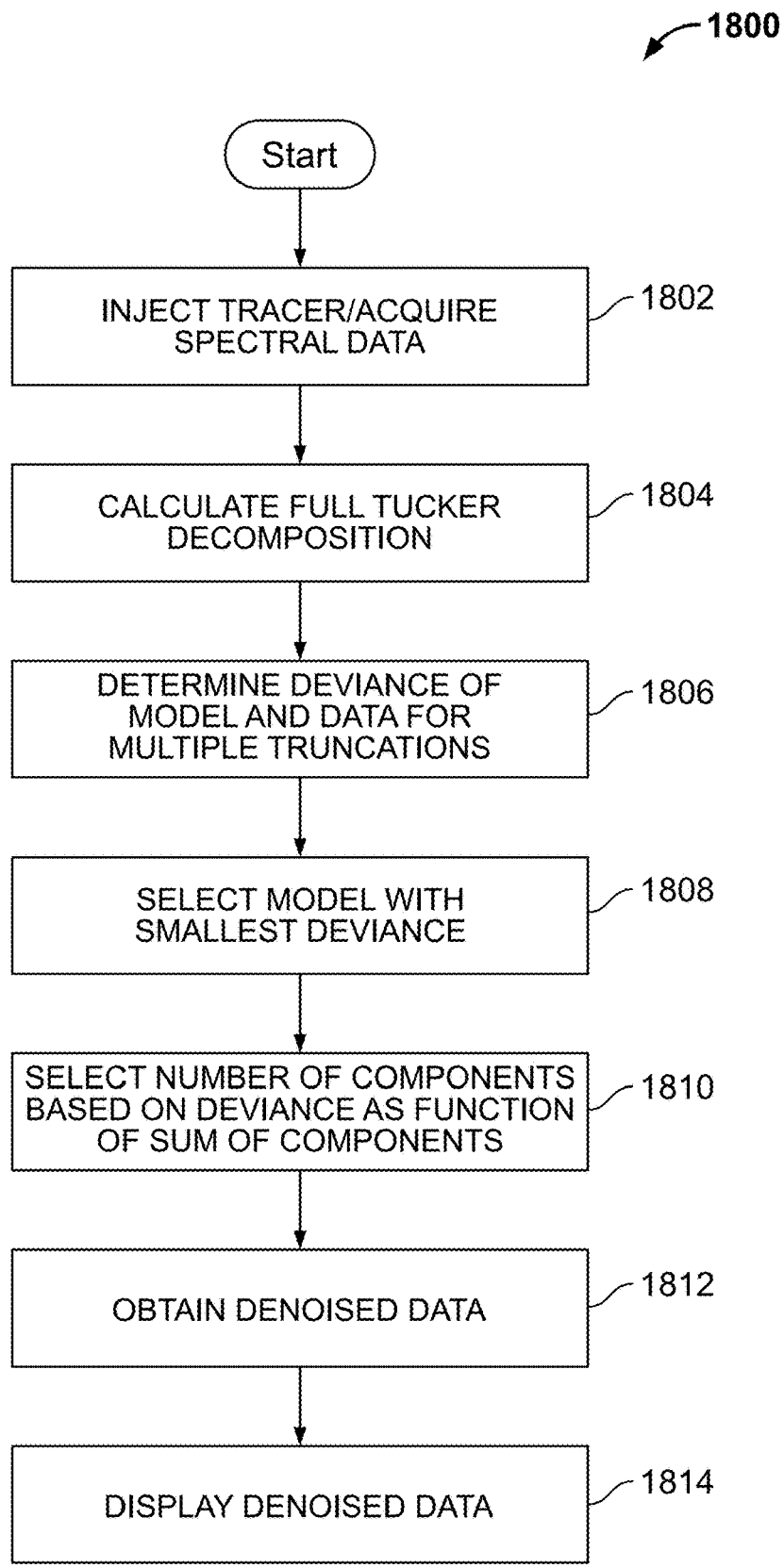
FIG. 18 illustrates a signal processing method based on a Tucker Decomposition.
Figure 19:
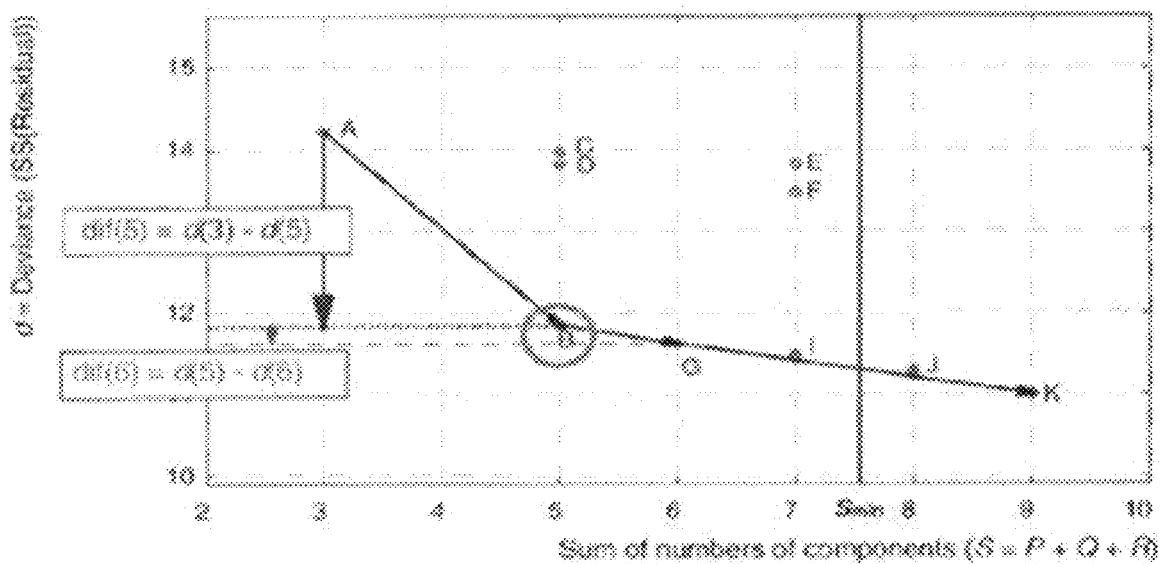
FIG. 19 is a representative difference graph for use in selecting a number of components in a Tucker Decomposition.

In one example, a procedure referred to herein as a "DifFit-criterion" can be used, as described in Timmerman and Kiers, "Three-mode principal components analysis: Choosing the numbers of components and sensitivity to local optima," Brit J Math Stat Psy. 53:1-16 (2000), which is incorporated herein by reference. A representative method 1800 is illustrated in FIG. 18. At 1802, a tracer is injected and data is acquired and at 1804, a full Tucker Decomposition is obtained. At 1806, a deviance d is determined as a sum of squares difference between model of the Tucker Decomposition (i.e., a truncated or rank reduced model) and actual data, for some or all possible truncations. At 1808, within models with a common number of components, a model with smallest deviance is selected. A number of components in then selected at 1810 based on deviance as function of a sum of the number of components using, for example, a graph such as shown in FIG. 19. The reduced number of components is then used to provide denoised data at 1812 which can be displayed at 1814 as an image or as metabolic rates at one or more locations.

A representative example is illustrated in FIG. 19. Points C, D, E and F are not optimal as another compression (i.e., truncation) with the same total number of components has a lower deviance. B is selected as it is associated with a larger improvement in deviance. Note the similarity to the Scree plot of FIG. 17. Note that the points noted as C, D, and B all have the same number of components, and provide the same noise reduction, but the particular components associated with point B are closest to the measured data.

Both Tucker Decomposition and multidimensional SVD (usually referred to as higher order SVD or higher order principal component analysis) decompose an experimental N-dimensional tensor into a core tensor and a set of orthogonal matrices. Some characteristics of higher order SVD are provided in Bergqvist and Larsson, "The Higher-Order Singular Value Decomposition: Theory and an Application," IEEE Signal Proc. Mag. 27:151-154 (2010), which is incorporated herein by reference. The difference between higher order SVD and the Tucker Decomposition is in the nature of the core tensor. In higher order SVD, the slices of the matrices in the core tensor are mutually orthogonal, while in the Tucker Decomposition they are not guaranteed to be so. Multidimensional SVD can therefore be seen as a special case of the more general Tucker Decomposition. Note that no analog of the Eckart-Young theorem exists for tensors, so the Tucker Decomposition to the data may be a better approximation than multidimensional SVD.

PARAFAC (aka CANDECOMP and Canonical Polyadic decomposition) are also special cases of the Tucker decomposition, wherein G is assumed to be superdiagonal (all non-diagonal entries zero). This is tantamount to making the assumption of complete separability (see below). As used herein, Tucker Decomposition and its variants include Multidimensional SVD, PARAFAC (aka CANDECOMP and Canonical Polyadic decomposition).

Figure 20A:
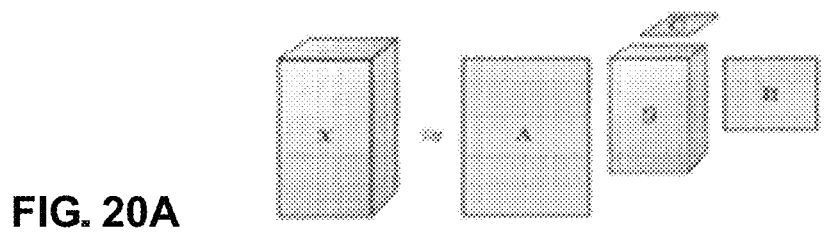
FIGS. 20A and 20C illustrate Tucker Decomposition.
Figure 20B:
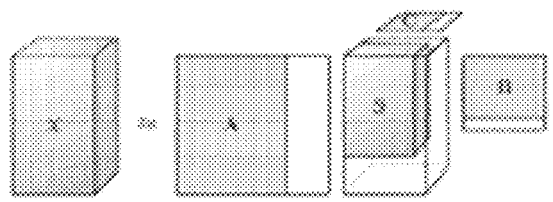
FIG. 20B illustrates truncation (rank reduction) of a Tucker Decomposition.
Figure 20C:
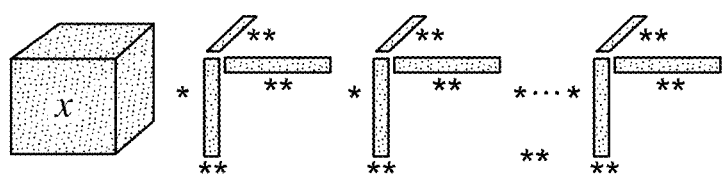

FIG. 20A and FIG. 20C illustrate Tucker Decomposition of a three way array. FIG. 20C illustrates how such a Tucker Decomposition can be truncated. With the Tucker Decomposition of FIG. 20C, truncation can be accomplished by omitted any of the terms in the series expansion, or setting the associated values to zero or small numbers. For example, as shown in FIG. 20B, any of the terms in the expansion can be reduced to zero.

Both SVD and N-dimensional Tucker Decomposition rely on sparsity—the fact that in this specific example, following the metabolism of an injected tracer, the data can be faithfully reconstructed using an approximation constructed from only a few vectors. The N-dimensional Tucker Decomposition also relies on the related concept of separability. Mathematically, strict separability means that a matrix can be expressed as linear combination of the vector outer products:

$$M = \sigma_1 u_1 v_1^T + \sigma_2 u_2 v_2^T \ldots \sigma_n u_n v_n^T,$$

In more common language, separability means the data in each dimension is independent of the others. The independence of the chemical shift of the metabolites on position in the image ensures that problem is ensures that this part of the problem is almost completely separable. For the most part, the kinetics are partially separable as well—the kinetics in each voxel falls into only a few different classes. Sparsity and separability may not hold for data from other imaging modalities or even other MRI applications. For instance, an fMRI signal from diffusion fMRI is likely to show a smaller degree of separability, as the signal will vary strongly throughout the image.

Voxel-by-voxel SVD is a fundamentally local procedure while the Tucker Decomposition is a type of global fitting. For example, if 5 components are selected for the spectra in both voxel-by-voxel SVD and Tucker Decomposition, in voxel-by-voxel SVD there can be 5 different components for each voxel, while in the Tucker Decomposition the 5 components are same throughout an image.

Figure 15:
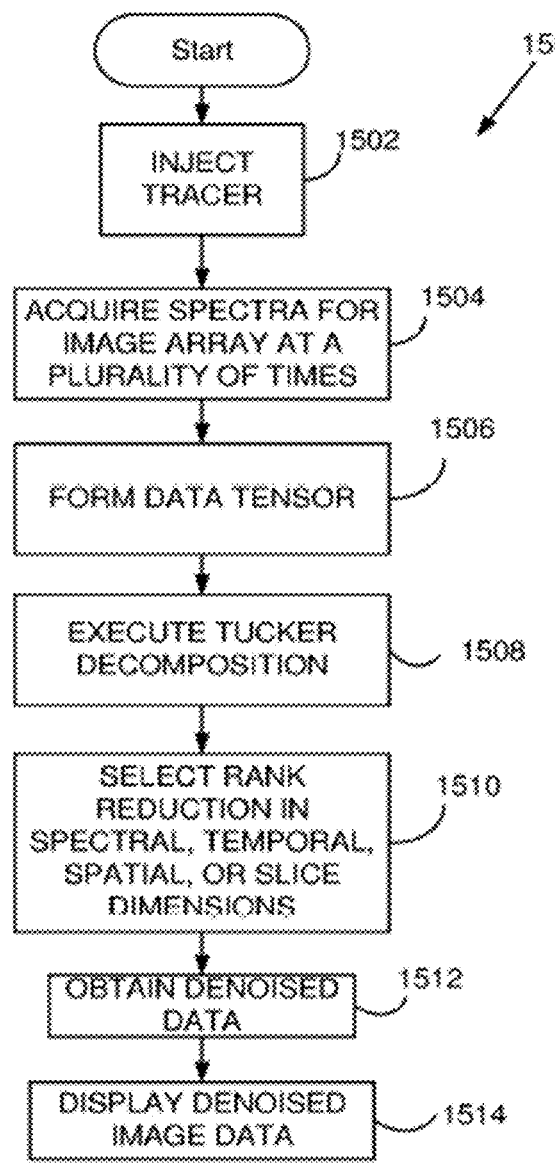
FIG. 15 illustrates a representative method of image data processing using a Tucker Decomposition with rank reduction.

With reference to FIG. 15, a method 1500 include injecting a tracer at 1502 and acquiring spectral data for an image array at a plurality of times at 1504. The acquired data is represented as a tensor at 1506, and processed using a Tucker Decomposition at 1508. At 1510, the Tucker Decomposition is rank reduced to reduce noise based on a number of metabolites or by trying several different reductions. In the tensor representation, rank reduction can be performed with respect to chemical shifts (i.e., spectral data), but can also be performed with respect to temporal and spatial dimensions, and in a slice direction as selected at 1510. As discussed above with respect to SVD, the representative data arrangement is associated with denoising in a spectral dimension, but could be applied by interchanging rows and columns (or a corresponding change in SVD computations) to denoise temporally. With a tensor representation, denoising can be associated with one or more of spectra, acquisition time, and/or spatial coordinates (x, y, z). At 1512, denoised data is obtained, and at 1514, the denoised data is used to generate a displayed image, metabolic rates, or other features associated with the acquired data.

Example 1. Single Point Measurements

Figure 3A:
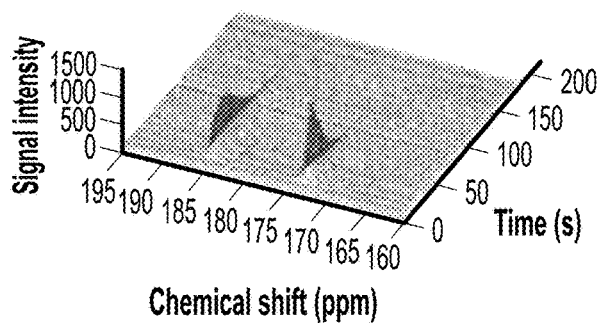
FIGS. 3A-3B show raw data from a pyruvic acid DNP measurement with good signal to noise ratio associated with conversion of pyruvate (chemical shift of 173 ppm) to lactate (chemical shift of 185 ppm).
Figure 3B:
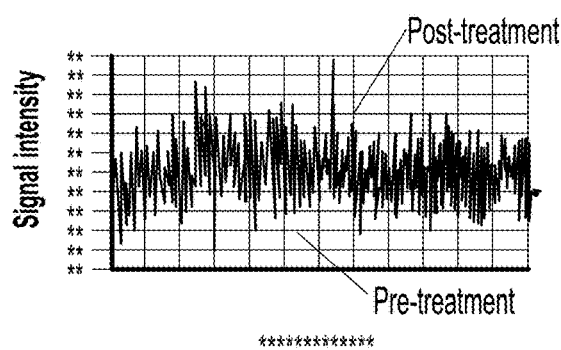
Figure 4A:
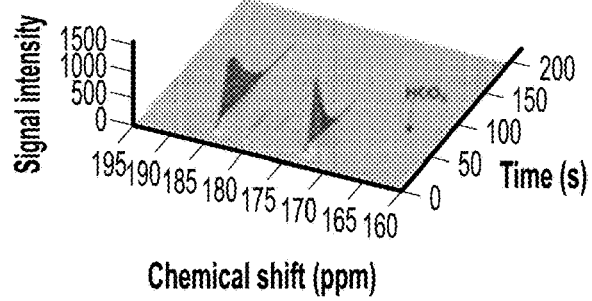
FIGS. 4A-4B show the data of FIGS. 3A-3B after detection and quantification using SVD and rank reduction to 5. In the raw data (FIGS. 3A-3B), the bicarbonate peak at 162.5 ppm is not detectable even though the overall signal to noise is high. Using the low rank (i.e., rank reduced) approximation, a kinetic profile of bicarbonate metabolism can be obtained as shown in FIGS. 4A-4B, allowing discrimination between drug treatment and control. No prior information about the bicarbonate signal or kinetics was used.
Figure 4B:
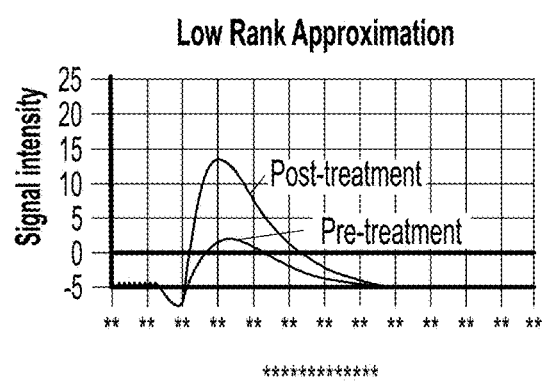
Figure 5A:
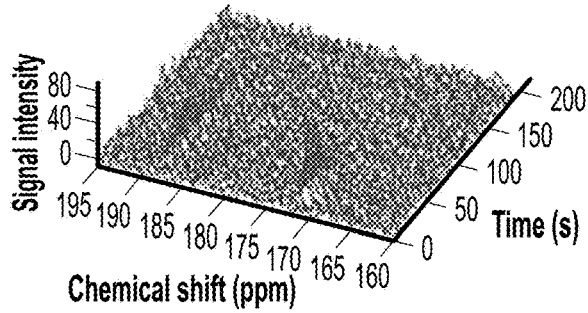
FIG. 5A shows additional noisy data.
Figure 5B:
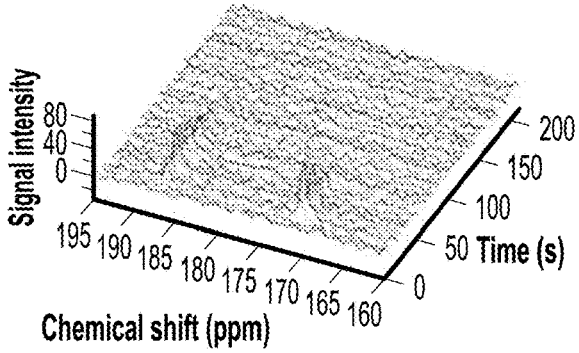
FIG. 5B shows an average of the data of FIG. 5A over 5 seconds.
Figure 6A:
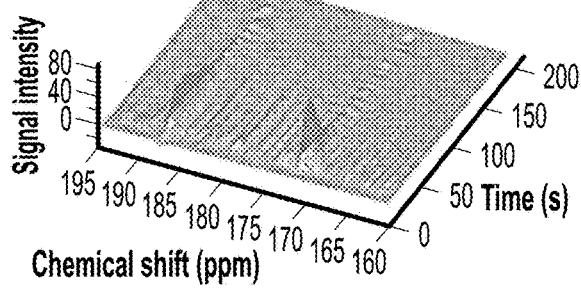
FIG. 6A shows the signal of FIG. 5A processed with SVD and rank reduction. Peaks corresponding to the two main metabolic products, pyruvate and lactate, are clearly visible, as well as two minor peaks corresponding to side products.
Figure 6B:
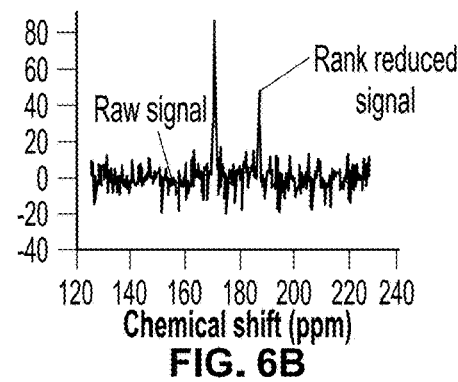
FIG. 6B is a graph of MRI signal amplitude as a function of chemical shift showing a 9 fold SNR enhancement obtained with SVD decomposition and rank reduction.

The disclosed approaches were applied to 41 mice to follow the metabolism of $^{13}$C tracer on a single pulse (not spatially resolved) MRI experiment. 300 µL of a 98 mM solution of hyperpolarized 1-$^{13}$C pyruvic acid was injected into the tail vein of nude mice bearing tumor xenografts in the left leg. Pyruvate is metabolized to $HCO_3$ in normal cells and lactate in cancerous ones exhibiting the Warburg effect. The dissolution process involved in making hyperpolarized pyruvic acid is not always perfect, resulting in spectra of varying quality. In ideal circumstances, the signal is strong enough after DNP that the main pyruvate (173 ppm) to lactate (185 ppm) conversion can be detected without additional signal processing (see FIG. 3A). In others, the signal is barely detectable (see FIG. 5A). Since the biochemistry is the same in each of these cases, the peak positions and approximate kinetics in the noisy data are known a priori. FIG. 3B shows bicarbonate intensity as a function of time with vitamin C pre- and post-treatment as obtained from raw data; FIGS. 4A-4B shows results obtained with SVD and rank reduction. A significant improvement in signal-to-noise ratio is apparent. Bicarbonate intensity as a function of time is not apparent in FIG. 3B while clearly shown in FIG. 4B. FIG. 5A shows raw data for a different single pulse measurement and FIG. 5B shows data averaged over 5 scans. SVD processed, rank reduced data are shown in FIGS. 6A-6B, exhibiting significant improvement in signal to noise ratio.

Figure 7:
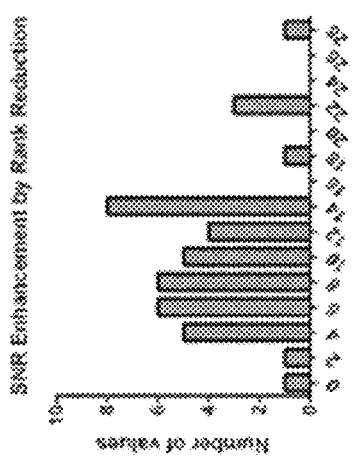
FIG. 7 shows signal to noise ratio (SNR) improvement using SVD with rank reduction.

FIG. 7 shows SNR improvement using rank reduction (r=3) in 41 $^{13}$C pyruvate tracer single pulse dynamic nuclear polarization experiments such as illustrated in FIGS. 4A-4B and 6A-6B. SNR is defined as intensity of a maximum signal divided by the standard deviation in a 40 point region of the spectrum where signal is known to be not present.

Example 2. Imaging

FIGS. 8A-8D show images associated with glucose metabolism illustrating denoising based on rank reduced SVDs. 50 mg of uniformly $^{13}$C labeled glucose was injected into the tail vein of a nude mouse and an 8×8 image of the tumor bearing mouse leg was acquired every 12 seconds for 90 minutes (450 images in total). The light outlines in FIGS. 8A-8D represent the tumor boundary. FIG. 8A is an anatomical image, and FIGS. 8B-8D are contour maps of lactate, lipid, and glucose localization, respectively, midway through the scans (i.e., at scan 225) based on denoised data. Signals associated with an individual voxel are shown in FIGS. 9A and 9B without and with denoising; respectively. FIG. 9C shows denoised signals for each of the 64 voxels, and FIG. 9D shows noisy data for one voxel.

Example 3. Imaging with Tucker Decomposition

Figure 10A:
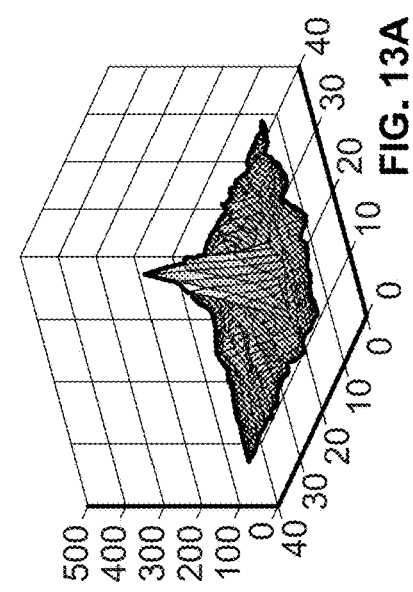
FIGS. 10A-10B show spectral image data from a hyperpolarized lactate image processed without noise reduction.
Figure 10B:
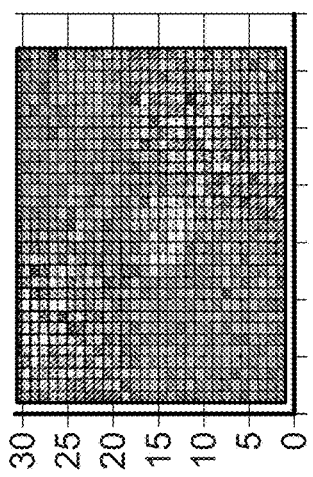
Figure 11A:
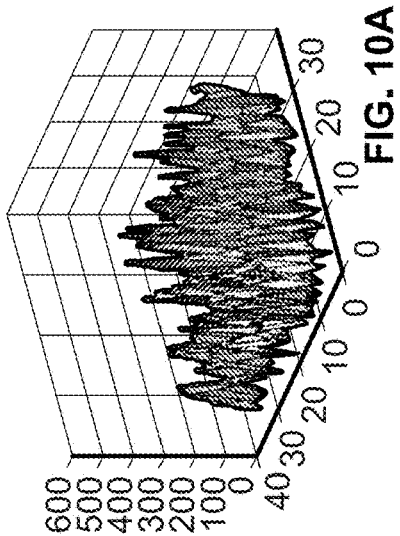
FIGS. 11A-11B show the image data of FIGS. 10A-10B processed with noise reduction via Tucker Decomposition with time domain rank reduction from 40 to 4.
Figure 11B:
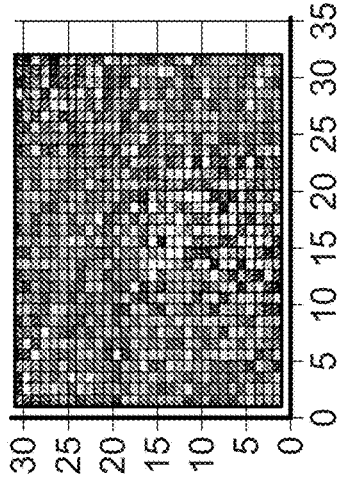
Figure 12A:
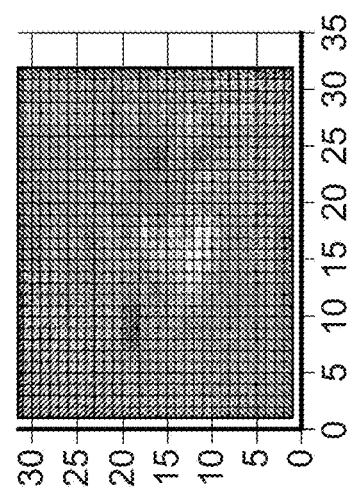
FIGS. 12A-12B show image data of FIGS. 10A-10B processed with Tucker Decomposition, time domain rank reduction from 40 to 4, and spatial dimension rank reduction from 32 to 16.
Figure 12B:
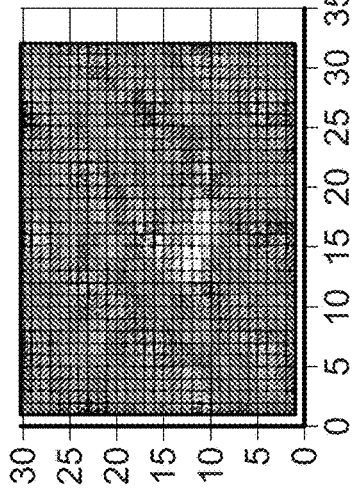
Figure 13A:
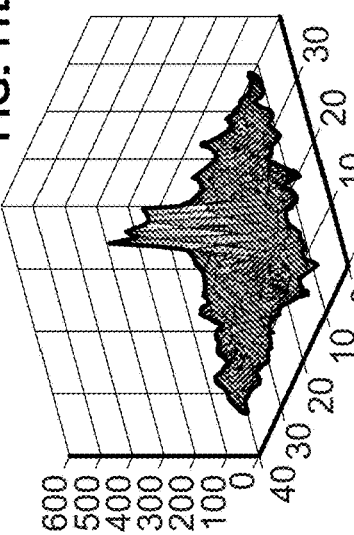
FIGS. 13A-13B show data corresponding to the processed data of FIGS. 12A-12B, further processed in a slice dimension.
Figure 13B:
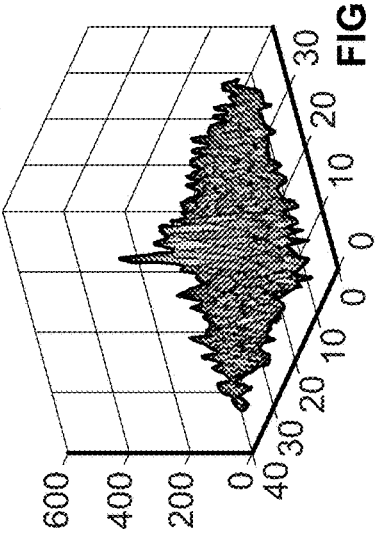

Data associated with one slice from a hyperpolarized lactate image set is illustrated in FIGS. 10A-13B. Spectral image data processed without noise reduction is shown in FIGS. 10A-10B, processed with noise reduction via Tucker Decomposition with time domain rank reduction from 40 to 4 (FIGS. 11A-11B), processed with Tucker Decomposition, time domain rank reduction from 40 to 4, and spatial dimension rank reduction from 32 to 16 (FIGS. 12A-12B), and further processed in a slice dimension (FIGS. 13A-13B). Data was acquired using a spectral selective pulse sequence that yields a series of images for each metabolite, one image for each time point.

Example 4. Detection of Multiple Products

Figure 16:
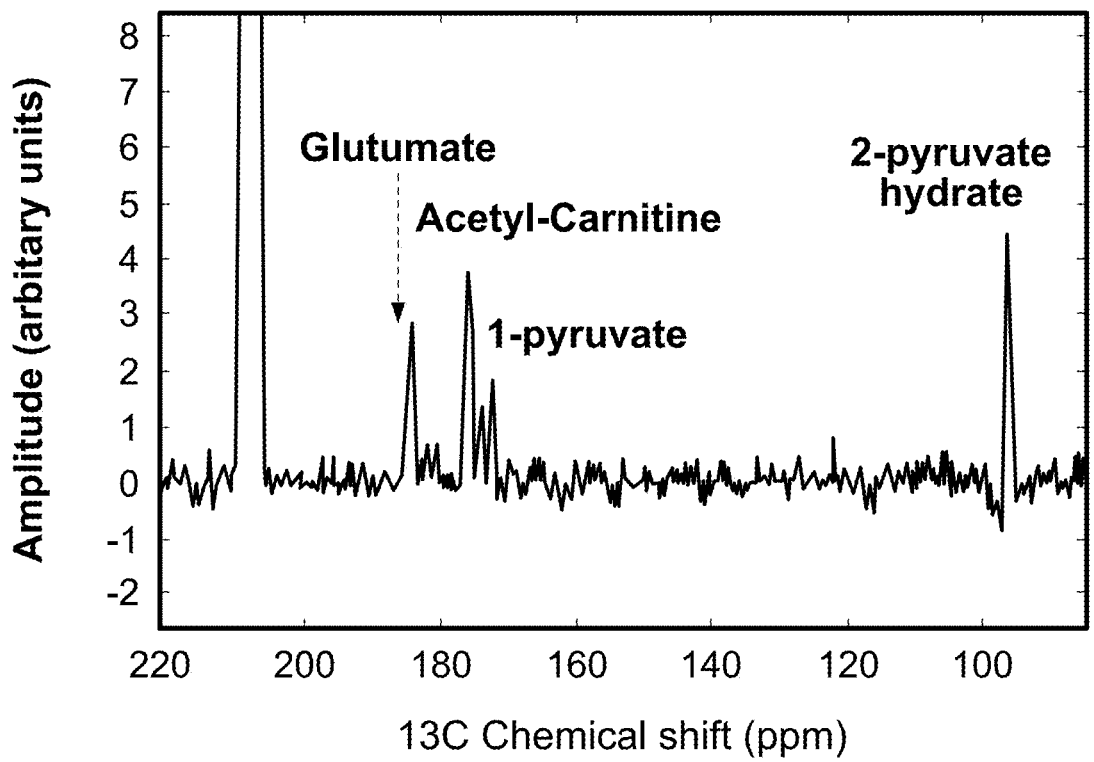
FIG. 16 illustrates multi-analyte data obtained with SVD denoising.

FIG. 16 illustrates detection of multiple products using SVD and rank reduction. Five distinct metabolic products associated with strong and weak signals are detected and quantified (2-pyruvate (strong) 207.8 ppm, Glutumate 184 ppm, 1-pyruvate doublet (weak) 172.1 and 174 ppm, 2-pyruvate hydrate (weak) 96.4 ppm, and Acyl-Carnitine 175 ppm). A time series of such data permits characterization of metabolic rates.

Example 5. Data Acquisition and Control

Figure 14:
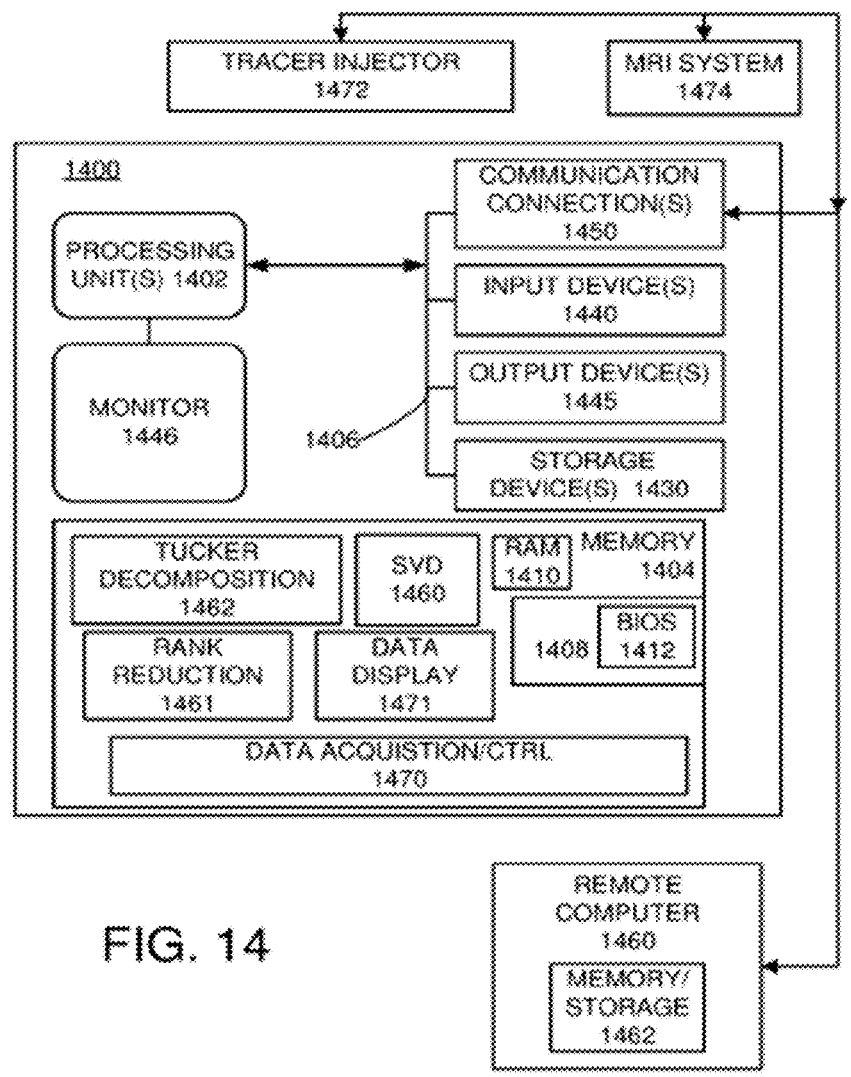
FIG. 14 is a schematic diagram of a representative data acquisition and processing system.

FIG. 14 and the following discussion are intended to provide a brief, general description of an exemplary computing/data acquisition environment in which the disclosed technology may be implemented. Although not required, the disclosed technology is described in the general context of computer executable instructions, such as program modules, being executed by a personal computer (PC), a mobile computing device, tablet computer, or other computational and/or control device. Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 14, an exemplary system for implementing the disclosed technology includes a general purpose computing device in the form of an exemplary conventional PC 1400, including one or more processing units 1402, a system memory 1404, and a system bus 1406 that couples various system components including the system memory 1404 to the one or more processing units 1402. The system bus 1406 may be any of several types of bus structures including a memory bus or memory controller, a peripheral bus, and a local bus using any of a variety of bus architectures. The exemplary system memory 1404 includes read only memory (ROM) 1408 and random access memory (RAM) 1410. A basic input/output system (BIOS) 1412, containing the basic routines that help with the transfer of information between elements within the PC 1400, is stored in ROM 1408.

The exemplary PC 140 further includes one or more storage devices 1430 such as a hard disk drive for reading from and writing to a hard disk, a magnetic disk drive for reading from or writing to a removable magnetic disk, an optical disk drive for reading from or writing to a removable optical disk (such as a CD-ROM or other optical media), and a solid state drive. Such storage devices can be connected to the system bus 1406 by a hard disk drive interface, a magnetic disk drive interface, an optical drive interface, or a solid state drive interface, respectively. The drives and their associated computer readable media provide nonvolatile storage of computer-readable instructions, data structures, program modules, and other data for the PC 1400. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1430 including an operating system, one or more application programs, other program modules, and program data. A user may enter commands and information into the PC 1400 through one or more input devices 1440 such as a keyboard and a pointing device such as a mouse. Other input devices may include a digital camera, microphone, joystick, game pad, satellite dish, scanner, or the like. These and other input devices are often connected to the one or more processing units 1402 through a serial port interface that is coupled to the system bus 1406, but may be connected by other interfaces such as a parallel port, game port, or universal serial bus (USB). A monitor 1446 or other type of display device is also connected to the system bus 1406 via an interface, such as a video adapter. Other peripheral output devices, such as speakers and printers (not shown), may be included.

The PC 1400 may operate in a networked environment using logical connections to one or more remote computers, such as a remote computer 1460. In some examples, one or more network or communication connections 1450 are included. The remote computer 1460 may be another PC, a server, a router, a network PC, or a peer device or other common network node, and typically includes many or all of the elements described above relative to the PC 1400, although only a memory storage device 1462 has been illustrated in FIG. 14. The personal computer 1400 and/or the remote computer 1460 can be connected to a logical a local area network (LAN) and a wide area network (WAN). Such networking environments are commonplace in offices, enterprise wide computer networks, intranets, and the Internet.

When used in a LAN networking environment, the PC 1400 is connected to the LAN through a network interface. When used in a WAN networking environment, the PC 1400 typically includes a modem or other means for establishing communications over the WAN, such as the Internet. In a networked environment, program modules depicted relative to the personal computer 1400, or portions thereof, may be stored in the remote memory storage device or other locations on the LAN or WAN. The network connections shown are exemplary, and other means of establishing a communications link between the computers may be used.

The memory 1404 generally includes computer-executable instructions for performing SVDs and Tucker Decompositions in respective memory portions 1460, 1462, and procedures for rank reduction and selection of suitable rank are stored in a memory portion 1461. Computer-executable instructions for data acquisition and control are stored in a memory portion 1470 for use with a tracer injector 1472 (such as a syringe pump) and a magnetic resonance imaging system. Acquired and processed data (e.g., rank reduced data) can be displayed using computer-executable instructions stored at memory portion 1471. As noted above, data acquisition, processing, and instrument control can be provided at an MRI system, or distribution at one or more processing devices using a LAN or WAN.

The examples above are described with respect to a sequence of MR images as a function of time in order to determine metabolite rates. However, the disclosed approaches can be used with any of a variety of data types to improve signal-to-noise ratio, and provide smoothing/noise reduction with respect to one or more data parameters.

Having described and illustrated the technology, it will be recognized that the illustrated embodiments can be modified in arrangement and detail. For instance, elements of the illustrated embodiment shown in software may be implemented in hardware and vice-versa. Also, the technologies from any example can be combined with the technologies described in any one or more of the other examples. It should be recognized that the illustrated embodiments are examples and should not be taken as a limitation on the scope of the disclosure. For instance, various components of systems and tools described herein may be combined in function and use. We therefore claim all subject matter that comes within the scope and spirit of the appended claims. Alternatives specifically addressed in these sections are merely exemplary and do not constitute all possible alternatives to the embodiments described herein.

We claim:

1. A magnetic resonance imaging apparatus, comprising:
   a magnet situated to establish an axial magnetic field in a specimen;
   a plurality of coils situated to apply electromagnetic pulse sequences to the specimen;
   a receiver situated to detect electromagnetic signals from the specimen in response to the applied electromagnetic pulse sequences; and
   a controller coupled to the plurality of coils so as to selectively apply the electromagnetic pulse sequences and to the receiver to store signal values associated with the detected signals for a plurality of specimen voxels, the controller being configured to:
   acquire a magnetic resonance imaging signal associated with a plurality of chemical shifts for a plurality of voxels at a plurality of times;
   arrange the magnetic resonance imaging signal as a data tensor;
   wherein that the controller is further configured obtain a Tucker decomposition of the data tensor; and
   simultaneously spatially and temporally rank reducing the Tucker decomposition to simultaneously produce spatially and temporally denoised voxel data for each of the plurality of voxels.

2. The magnetic resonance imaging apparatus of claim 1, wherein the controller processes the detected signals by rank reducing singular value decompositions associated with matrix representations associated with each the plurality of specimen voxels.

3. The magnetic resonance imaging apparatus of claim 2, wherein the rank reduction of the singular value decomposition is based on a number of analytes.

4. The magnetic resonance imaging apparatus of claim 3, further comprising an injector situated to inject a tracer into the specimen, the injector coupled to the controller so that the detected electromagnetic signals are associated with metabolism of the injected tracer, wherein the analytes include the tracer or one or more metabolic products associated with the tracer.

5. The magnetic resonance imaging apparatus of claim 4, wherein the number of analytes corresponds to a number of metabolic products.

6. The magnetic resonance imaging apparatus of claim 5, wherein the matrix representation for each voxel is an m×n data matrix, wherein m is an integer number of measurement times and n is an integer number of measured chemical shifts and the singular value decomposition includes matrices U, Σ, VT, wherein U is an m×m unitary matrix, Σ is a diagonal m×n matrix with non-negative real numbers on the diagonal, and VT is an n×n orthogonal matrix.

7. The magnetic resonance imaging apparatus of claim 6, wherein rank reduction includes setting r smallest diagonal values of the matrices Σ to zero to form matrices Σ', wherein the rank-reduced data matrices are obtained as matrix products U·Σ'·VT.

8. The magnetic resonance imaging apparatus of claim 7, wherein the diagonal values of the matrices Σ and Σ' are arranged in rows of the matrices from largest to smallest.

9. The magnetic resonance imaging apparatus of claim 8, wherein the magnetic resonance imaging signal is associated with the plurality of chemical shifts for the plurality of voxels at the plurality of times, and for each voxel, the magnetic resonance imaging signal is arranged as a data matrix, a singular value decomposition of the data matrix is obtained that is then rank reduced, and rank reduced data matrices are produced for each of the plurality of voxels.

10. The magnetic resonance imaging apparatus of claim 9, further comprising displaying an image using the rank reduced data matrices.

\* \* \* \* \*